(12) United States Patent
Foster et al.

(10) Patent No.: US 7,400,096 B1
(45) Date of Patent: Jul. 15, 2008

(54) LARGE AREA PLASMA SOURCE

(75) Inventors: John Foster, Strongsville, OH (US);
Michael Patterson, Brunswick, OH (US)

(73) Assignee: The United States of America as represented by the Administrator of The National Aeronautics and Space Administration, Washington, DC (US)

( * ) Notice: Subject to any disclaimer, the term of this patent is extended or adjusted under 35 U.S.C. 154(b) by 622 days.

(21) Appl. No.: 10/894,225

(22) Filed: Jul. 19, 2004

(51) Int. Cl.
*H01J 7/24* (2006.01)
*C23F 1/00* (2006.01)
*C23C 14/00* (2006.01)

(52) U.S. Cl. ............................ 315/111.41; 156/345.36; 204/298.38

(58) Field of Classification Search .................. 315/111.01–111.91; 250/492.1–492.3, 493.1; 156/345.35–345.36; 118/723; 204/298.38
See application file for complete search history.

(56) References Cited

U.S. PATENT DOCUMENTS

| | | | |
|---|---|---|---|
| 5,079,481 A * | 1/1992 | Moslehi ................. | 315/111.41 |
| 5,133,825 A | 7/1992 | Hakamata et al. ...... | 156/345.42 |
| 5,308,417 A * | 5/1994 | Groechel et al. .............. | 216/67 |
| 5,534,231 A * | 7/1996 | Savas .......................... | 216/67 |
| 5,620,522 A * | 4/1997 | Ichimura et al. ...... | 118/723 MR |
| 5,762,814 A * | 6/1998 | Ohara et al. ................... | 216/70 |
| 5,975,014 A | 11/1999 | Dandl ................ | 118/723 MW |
| 6,084,356 A * | 7/2000 | Seki et al. .............. | 315/111.41 |
| 6,350,347 B1 | 2/2002 | Ishii et al. .............. | 156/345.48 |
| 6,380,684 B1 | 4/2002 | Li et al. .................. | 315/111.21 |
| 6,390,019 B1 | 5/2002 | Grimbergen et al. .... | 118/723 R |
| 6,504,159 B1 | 1/2003 | Keller ..................... | 250/423 R |
| 6,551,445 B1 | 4/2003 | Yokogawa et al. ...... | 156/345.46 |
| 6,551,447 B1 * | 4/2003 | Savas et al. ............. | 156/345.48 |
| 6,632,324 B2 | 10/2003 | Chan ....................... | 156/345.48 |
| 6,805,770 B1 * | 10/2004 | Oster ....................... | 156/345.42 |
| 6,922,019 B2 * | 7/2005 | Leung et al. ............ | 315/111.21 |
| 7,316,199 B2 * | 1/2008 | Horioka et al. .......... | 118/723 R |
| 2001/0001185 A1 * | 5/2001 | Setoyama et al. ............ | 156/345 |
| 2001/0008171 A1 | 7/2001 | Fukuda et al. .............. | 156/345 |
| 2003/0006708 A1 | 1/2003 | Leung et al. ............ | 315/111.81 |
| 2003/0150562 A1 | 8/2003 | Quon ...................... | 156/345.47 |

* cited by examiner

*Primary Examiner*—Thuy Vinh Tran
*Assistant Examiner*—Tung X Le
(74) *Attorney, Agent, or Firm*—Howard M Cohn

(57) ABSTRACT

An all permanent magnet Electron Cyclotron Resonance, large diameter (e.g., 40 cm) plasma source suitable for ion/ plasma processing or electric propulsion, is capable of producing uniform ion current densities at its exit plane at very low power (e.g., below 200 W), and is electrodeless to avoid sputtering or contamination issues. Microwave input power is efficiently coupled with an ionizing gas without using a dielectric microwave window and without developing a throat plasma by providing a ferromagnetic cylindrical chamber wall with a conical end narrowing to an axial entrance hole for microwaves supplied on-axis from an open-ended waveguide. Permanent magnet rings are attached inside the wall with alternating polarities against the wall. An entrance magnet ring surrounding the entrance hole has a ferromagnetic pole piece that extends into the chamber from the entrance hole to a continuing second face that extends radially across an inner pole of the entrance magnet ring.

16 Claims, 5 Drawing Sheets

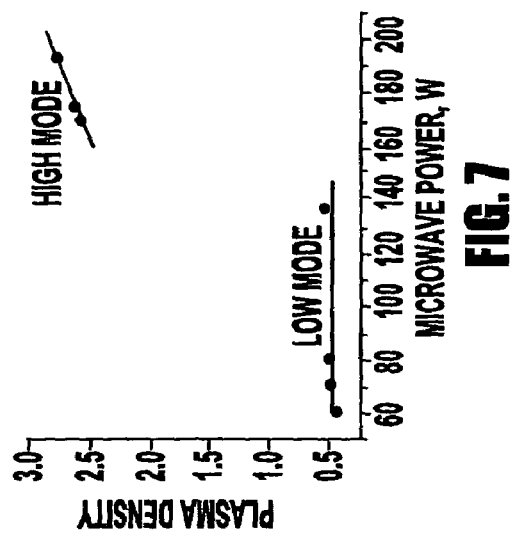
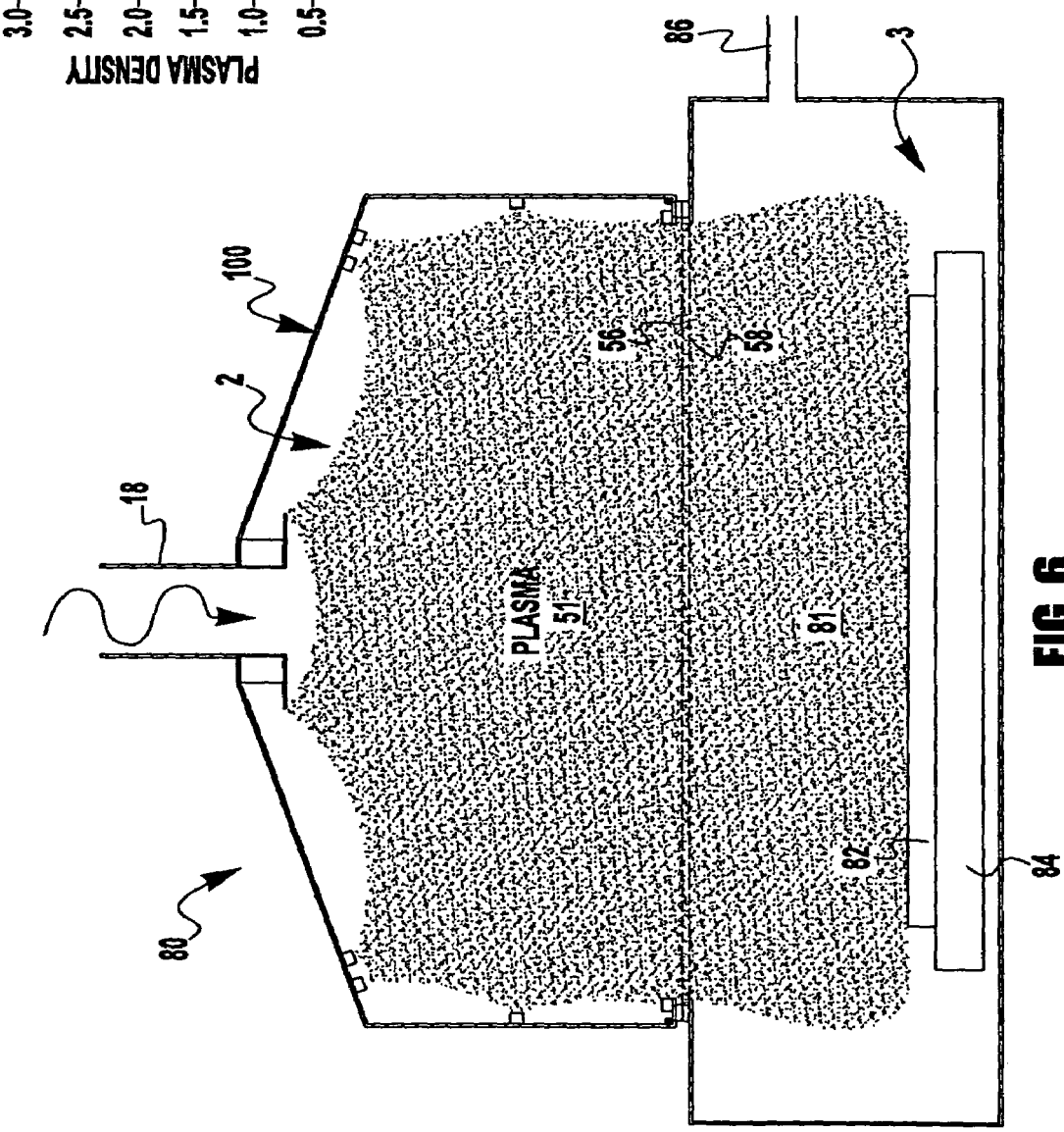
FIG. 7
FIG. 6

LARGE AREA PLASMA SOURCE

STATEMENT REGARDING FEDERALLY SPONSORED RESEARCH OR DEVELOPMENT

The invention described herein was made by an employee of the United States Government and may be manufactured and used by or for the Government for Government purposes without the payment of any royalties thereon or therefore.

TECHNICAL FIELD OF THE INVENTION

The present invention relates to large area plasma sources, more particularly to electron cyclotron resonance (ECR) large area plasma sources, and most particularly to large area ECR plasma sources using only permanent magnets.

BACKGROUND OF THE INVENTION

The National Aeronautic and Space Administration (NASA) has determined a need to develop a long life plasma generator (source) for use as an ion propulsion device (e.g., an ion thruster) in long duration space missions. Requirements for the plasma source include: long life without maintenance, low power operation, high plasma density, and high plasma uniformity across its diameter.

Propulsion systems capable of providing very high specific impulse (6000-9000 seconds) are desirable as primary propulsion options for far term missions to the outer planets and beyond. Gridded ion thrusters systems are capable of satisfying such mission requirements. Ion thruster systems used for such an application will be required to operate continuously for perhaps as long as 5-10 years. Such long continuous operation times place stringent lifetime requirements on thruster components and subsystems. In general, thruster lifetime is limited by essentially four potential failure modes: 1) discharge cathode failure, 2) neutralizer failure, 3) ion optics failure and 4) electron backstreaming. Failure modes 1 and 2 are related primarily to hollow cathode failure. Failure mode 3 is related to screen and accelerator grid degradation via erosion as well as grid to grid shorts arising from such erosion phenomena. Electron backstreaming becomes more and more of a problem as accelerator grid apertures widen due to erosion. High levels of backstreaming electrons can destroy the discharge cathode. One potential solution to this problem is the use of a magnetic grid. Potential design solutions also exist for increasing the lifetime of the ion optics such as the use of different electrode materials such as titanium or carbon or by simply increasing the electrode thickness. Hollow cathode failure can occur after prolonged operation due to physical erosion or to the depletion of barium in the insert brought on by barium diffusion and subsequent evaporation or the formation of tungstates that tie up the barium. Because of such phenomena, ion thruster hollow cathodes have a life of order 28,000 hours, which is not sufficient for those missions requiring more than three years of continuous thruster operation. The present invention focuses on the elimination of the discharge cathode and its failure modes.

NASA Glenn Research Center (GRC) has initiated an effort to eliminate the lifetime issues associated with conventional hollow cathodes by investigating electrodeless plasma production approaches. Microwave electron cyclotron resonance (ECR) discharge was selected as the plasma generation method based on a parametric comparison with other electrodeless plasma production approaches. In the ECR process, electrons resonantly absorb energy from an imposed electromagnetic field. The input radiation field is set at the electron cyclotron frequency. At this resonance, the electrons can gain energy continuously. This resonant process takes place on surfaces of constant magnetic field B that are established by the magnetic circuit. B=875 G for a microwave frequency of 2.45 GHz (Giga-Hertz). The hot electrons produced during this process ionize neutral gas, thereby generating the discharge plasma completely electrodeless. This approach has been successfully implemented on the Institute for Space and Astronautical Sciences (ISAS) MUSES-C asteroid rendezvous spacecraft in which a 400 W (watt) microwave ion thruster will be used for primary propulsion. Compared to the present invention, the MUSES-C thruster device is considerably smaller (10 cm beam diameter); it operates at 4.2 GHz (a more expensive frequency range, since higher frequency microwave tubes are less efficient than 2.45 GHz tubes); and primarily small volume, ring ECR plasmas are produced in the device. Also, the MUSES-C device suffers from cut-off issues associated with the way the microwaves are launched into its chamber (its microwave input port can be obstructed by the formation of a "throat" plasma in the port); the plasma source size is inherently small owing primarily to its higher frequency; power required to create a plasma ion is higher because ECR takes place closer to magnet rings, thereby increasing plasma losses to walls; and the device is inherently power limited because of the aforementioned throat plasma problem. The present invention is intended to improve upon all these limitations of the prior art such as the MUSES-C thruster.

Electromagnets can be used to produce the magnetic fields needed for ECR plasma generation, but power demands of electromagnets preclude their use for low power space propulsion. Furthermore, electromagnet coils produce magnetic fields that are highest at the coil axis. Magnetic field geometries more suitable for the formation of uniform ECR plasmas and improved plasma containment can be obtained with permanent magnet arrangements. Efficient plasma containment is possible with permanent magnet arrangements.

The application of permanent magnet ECR to generate an ion thruster discharge plasma has been investigated by NASA in the past. A cylindrical 30 cm (centimeter) diameter, permanent magnet ECR ion engine with power up to 700 W (watts) was studied by a NASA GRC contracted activity in the 1980s as a study looking into the possibility of using ECR for ion thrusters. The conclusion of the study was that rather than the permanent magnet approach tested, an all electromagnetic configuration might perform better, given that the permanent magnet version never could be optimized. During this effort, ECR plasma sources with discharge losses less than 150 W/A (watts per amp) at 5 GHz were tested. However, this device did not generate uniform plasmas (a consequence of its microwave injection scheme), and there was difficulty reaching predicted plasma densities. Additionally, it operated at 5 GHz, an expensive frequency range; the method of microwave injection made it inherently difficult to generate uniform, larger area plasmas; and the device tended to "mode jump" (i.e., the plasma was not stable at all conditions). The present invention overcomes these difficulties and achieves a well optimized permanent magnet configuration.

The present invention disclosure is based on more recent microwave ion thruster research activity at NASA GRC that focused on the development of a higher power ion thruster system (40 cm diameter, 5 kW (kilowatt)). The goal of this activity was to develop an extremely long life version of the NASA Evolutionary Xenon Ion Thruster (NEXT). The early stages of this development activity have utilized 2.45 GHz as the operating frequency. This operating frequency affords one a cost effective means of mapping out general operation characteristics of a multipole plasma source. Issues such as magnetic circuit optimization, DC isolation, impedance matching, and power injection issues can all be studied using this test-bed plasma source. The beam current design goal for this 2.45 GHz ECR test-bed ion thruster was 1.1 A at a microwave input power of 300 W or less.

The maximum extractable current from a plasma is proportional to the product of the plasma density and the square root of the electron temperature. Thermal background electron temperatures are expected to range between 2 and 5 eV. To first order, the maximum plasma density obtainable depends primarily on microwave excitation frequency. The plasma in the ECR zones can reach a maximum density determined by the condition where the microwave frequency equals the local plasma frequency. Normally, at plasma frequencies higher than the microwave frequency, the microwaves are no longer absorbed, but reflected instead. Scaled up embodiments of the present invention will require a microwave frequency of 5 GHz or greater to achieve the required beam currents for the 5 kW operating condition. The higher frequency will also significantly reduce the discharge losses. Teachings from the present 2.45 GHz source embodiment will be implemented in the 5 GHz design.

The prior art evidenced in patent literature shows various microwave, permanent magnet, ECR plasma sources, but they suffer from limitations that the present invention overcomes.

US Patent Application Publication 2003/0006708 (Leung et al.; 2003) discloses a compact microwave ion source with permanent magnet rings (12). Gas in the 10 cm diameter chamber (14) is ionized by electron cyclotron resonance to produce plasma. A microwave antenna (22) is immersed in the plasma. The plasma density can be increased by boosting the microwave ion source by the addition of an RF antenna (42).

U.S. Pat. No. 5,975,014 (Dandl; 1999) discloses a large diameter, permanent magnet ECR plasma source with high density and uniformity. It uses a coaxial resonant multi-port microwave applicator (12) to introduce microwave power uniformity. An essential design element of the coaxial resonant multiport antenna array (60, in the plasma chamber—see FIGS. 2-3) is the geometric configuration of individual radiating stubs (62), that are formed in openings (63) in an outer conductor (64) of a coaxial line or coaxial waveguide (66) coupled to the power source (54), together with the spacing of successive stubs (62).

U.S. Pat. No. 5,133,825 (Hakamata et al.; 1992) discloses a plasma generating apparatus wherein a pair of hollow diskshaped rare earth magnets (21a, 21b) are provided around an outer periphery of a vessel wall (20) of a plasma generating chamber (1). A microwave transmissive window (24) is provided in one end plate of the plasma generating chamber, while a waveguide (3) is installed adjacently to the window, and a microwave generator (10), such as a magnetron, is provided on the waveguide. Hakamata's FIG. 5 illustrates an apparatus provided with a plurality of microwave generators (10) and preliminary plasma chambers (91) with respect to one main plasma chamber (94), wherein the size of the main plasma chamber is enlarged in diameter by increasing the number of the preliminary plasma chambers (91). Hakamata's FIGS. 6, 10, 12, and 13 illustrate several arrangements of apparatus wherein the cross-sectional area of the plasma generating chamber is substantially continuously increased from the waveguide-connecting side to the ion extraction side. Accordingly, the average intensity of the magnetic fields inside the plasma generating chamber becomes maximal at an axial position offset to the waveguide, and the magnetic field intensity decreases gradually toward the ion-extraction side, thereby expanding the plasma diameter. In addition, the plasma which is generated in the plasma chamber is pushed to the ion-extraction side by virtue of the action of the gradient in the magnetic field intensity.

U.S. Pat. No. 5,620,522 (Ichimura et al.; 1997) discloses a microwave plasma generator wherein a permanent magnet ring (3) forms an intense magnetic field exceeding an intensity of an ECR magnetic field at a microwave exit (6a) of a dielectric body (6) in an electron heating space chamber (1). The intensity of the magnetic field formed by the permanent magnet (6) decreases rapidly to zero at a point (14) in the vicinity of the boundary of the electron heating space chamber (1) and a plasma generating space chamber (2). A gas introducing means (7) is shown at the top of the plasma generating space chamber (2).

It is an object of the present invention to overcome limitations of the prior art. For example, microwave antennas, electrodes, and such should be eliminated from the plasma chamber where they can erode, thereby producing contamination and reducing lifetime of the device. For example, dielectric bodies (microwave windows) between the microwave source and the plasma chamber should be eliminated because in applications with metal vapor in the plasma, deposition of films on the dielectric window would prevent microwaves from entering the discharge chamber and/or from coupling into the source. (It should be noted that conducting vapor fluxes are intentionally part of various plasma processing environments, and can also occur during ion thruster operation due to low level grid sputtering. Furthermore, a microwave window can itself be a contamination source.)

BRIEF SUMMARY OF THE INVENTION

According to the invention, a plasma source comprises a plasma chamber having a central axis, an entrance hole having the same central axis at one axial end of the chamber and an exit plane having the same central axis at an opposed axial end; a chamber wall composed of a ferromagnetic material that extends from the entrance hole to the exit plane to surround the plasma chamber; an approximately annular entrance magnet ring surrounding the entrance hole, and attached inside the chamber wall such that a first magnetic pole is against the chamber wall and a second opposed magnetic pole is an inner pole facing into the plasma chamber; and an entrance pole piece composed of a ferromagnetic material, having a first face that is attached to and extends substantially axially into the plasma chamber from the entrance hole to a continuing second face that extends perpendicularly away from the central axis across at least a portion of the inner pole of the entrance magnet ring.

Further according to the invention, the plasma source is such that the second face extends farther away from the central axis than the entrance magnet ring.

According to the invention, the plasma source further comprises: a microwave waveguide having an inside dimension approximately equal to an inside dimension of the entrance hole, and having the same central axis as the plasma chamber, wherein the waveguide has an open end attached to the entrance hole and is aligned for directing microwaves through the entrance hole along the central axis into the plasma chamber; a first section of the wall that extends out away from the central axis from the entrance hole to a peripheral junction; a second section of the wall that extends mostly axially from the junction to the exit plane; an approximately annular first intermediate magnet ring attached inside the wall near the junction such that a one of its first and second magnetic poles is against the wall and the one magnetic pole's opposed magnetic pole is facing into the plasma chamber; an annular exit flange composed of a ferromagnetic material, that is attached to and extends into the plasma chamber toward the central axis along the exit plane from the wall to an inner edge; an approximately annular exit magnet ring surrounding the inner edge of the exit flange, and attached inside the exit flange such that a one of its first and second magnetic poles is against the exit flange and the one magnetic pole's opposed magnetic pole is facing into the plasma chamber; and a magnetic circuit configuration wherein all magnet rings are composed of permanent magnet material such that inward facing magnetic poles alternate polarity versus adjacent magnet rings while proceeding along the wall sequentially from the entrance magnet ring to the exit magnet ring.

According to the invention, preferably the plasma source is such that the first intermediate magnet ring further comprises a pair of relatively closely spaced, approximately annular, oppositely polarized magnet rings both being attached inside the first section of the wall. Also preferably, the plasma source further comprises an approximately annular second intermediate magnet ring attached inside the wall between the first intermediate magnet ring and the exit magnet ring, such that a one of the second intermediate magnet ring's first and second magnetic poles is against the wall and the one magnetic pole's opposed magnetic pole is facing into the plasma chamber. Also preferably, the plasma source is such that the plasma source has a circular cross section in any plane normal to the central axis, such that the circular cross sections are coaxial with the central axis; the waveguide is a cylindrical waveguide; the first section of the wall is conical, extending radially outward from the entrance hole at an obtuse angle (θ) with respect to the waveguide; and the second section of the wall is substantially cylindrical.

According to the invention, further preferably the plasma source configuration and dimensions are optimized such that: the first intermediate magnet ring further comprises a pair of relatively closely spaced, approximately annular, oppositely polarized first and second conical section magnet rings, both being attached inside the first section of the wall; an approximately annular second intermediate magnet ring is attached inside the second section of the wall between the first intermediate magnet ring and the exit magnet ring, such that a one of the second intermediate magnet ring's first and second magnetic poles is against the wall and the one magnetic-pole's opposed magnetic pole is facing into the plasma chamber; the exit magnet ring, and all of the intermediate magnet rings have a magnet width dimension WM measured normal to a magnet ring circumferential direction and parallel to the wall or exit flange, whichever the magnet ring is attached to; and have a magnet height measured mutually orthogonal to the magnet width (WM) and to the magnet ring circumferential direction, such that the magnet width dimension WM is between 1.05 and 1.45 times the magnet height (HM); measured in units of magnet width dimension WM: the diameter of the cylindrical section is 62.99 WM; the inside diameter of the entrance hole, the cylindrical waveguide and the entrance pole piece is 12.00 WM; and the inside diameter of the exit flange is 95.20 WM; also measured in units of magnet width dimension WM: an entrance magnet height is approximately equal to an axial face height for the entrance pole piece which covers it and is 3.20 WM; an entrance magnet width is 2.00 WM, whereas a radial face width for the entrance pole piece which covers it is approximately 4.00 WM; also measured in units of magnet width dimension WM: a first dimension measured along the wall from the entrance magnet ring to the center of the first conical section magnet ring 32a is 22.60 WM; a second dimension measured along the wall from the center of the first conical section magnet ring to the center of the second conical section magnet ring is 2.16 WM; a third dimension measured along the wall from the center of the second conical section magnet ring to the junction is 3.65 WM; a fourth dimension measured along the wall from the junction to the center of the cylindrical section magnet ring is 11.20 WM; a fifth dimension measured along the wall from the center of the cylindrical section magnet ring to the axially innermost edge of the exit magnet ring is 11.69 WM; a sixth dimension measured along the wall from the axially innermost edge of the exit magnet ring to the exit flange is 0.80 WM; a seventh dimension measured along the exit flange from the cylindrical section wall to a radially innermost side of the exit magnet ring is 2.00 WM; and the seventh dimension is approximately equal to a radially-measured width of the exit flange.

Further according to the invention, preferably the plasma source is such that: the magnet height is 0.80 times the magnet width dimension WM; and the radial face width for the entrance pole piece is 4.00 times the magnet width dimension WM.

Further according to the invention, preferably the plasma source is such that the obtuse angle (θ) is approximately 110 degrees.

According to the invention, preferably the plasma source further comprises: a microwave source feeding microwave power into a rectangular waveguide; and a rectangular to cylindrical waveguide transition connected to the cylindrical waveguide for feeding microwave power into the cylindrical waveguide. Further preferably, the plasma source further comprises a sliding short in the cylindrical waveguide.

According to the invention, preferably the plasma source further comprises a magnet cover composed of nonmagnetic material that covers exposed surfaces of all magnet rings except for the entrance magnet ring.

According to the invention, preferably the plasma source is such that the ferromagnetic material is 0.03 inches thick.

According to the invention, preferably the plasma source further comprises a tubular gas injection ring attached to the second section of the wall, such that gas is injected approximately upstream relative to the microwaves. Further preferably, the gas injection ring is attached close to the exit flange and radially between the exit magnet ring and the wall.

According to the invention, a method for efficiently coupling microwave power input with gas in a plasma generating chamber, comprises the steps of: surrounding the plasma chamber with a wall that has a central axis and an entrance hole having the same central axis for providing an opening through the wall at one axial end of the plasma chamber; directing microwaves from an open end of a waveguide through the entrance hole into the plasma chamber along the central axis, wherein the central axis is shared by the waveguide; composing the wall of a ferromagnetic material; attaching an approximately annular entrance magnet ring inside the chamber wall surrounding the entrance hole, such that a first magnetic pole is against the chamber wall and a second opposed magnetic pole is an inner pole facing into the plasma chamber; and providing an entrance pole piece composed of a ferromagnetic material, having a first face that is attached to and extends substantially axially into the plasma chamber from the entrance hole to a continuing second face that extends perpendicularly away from the central axis across at least a portion of the inner pole of the entrance magnet ring.

According to the invention, the method further comprises the step of extending the second face farther away from the central axis than the entrance magnet ring.

According to the invention, the method further comprises the steps of: forming a first section of the wall that extends out away from the central axis from the entrance hole to a peripheral junction such that the first section is sloped at an obtuse angle (θ) with respect to the waveguide; forming a second section of the wall that extends mostly axially from the junction in a direction away from the waveguide; and generating a cusped magnetic field inside the chamber by attaching inside the wall one or more spaced apart, approximately annular, magnet rings such that outward facing magnetic poles are against the wall and inward facing magnetic poles alternate polarity versus adjacent magnet rings while proceeding along the wall sequentially away from the entrance magnet ring.

Further according to the invention, the method is such that: the wall has a circular cross section in any plane normal to the central axis, such that the circular cross sections are coaxial with the central axis; the waveguide is a cylindrical waveguide; the first section of the wall is conical, extending radially outward from the entrance hole at an obtuse angle (θ) with respect to the waveguide; and the second section of the wall is substantially cylindrical.

According to the invention, the method further comprises the step of using permanent magnets for all of the magnet rings.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawing figures. The figures are intended to be illustrative, not limiting. Although the invention is generally described in the context of these preferred embodiments, it should be understood that it is not intended to limit the spirit and scope of the invention to these particular embodiments.

Certain elements in selected ones of the drawings may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity.

Elements of the figures can be numbered such that similar (including identical) elements may be referred to with similar numbers in a single drawing. For example, each of a plurality of elements collectively referred to as 199 may be referred to individually as 199a, 199b, 199c, etc. Or, related but modified elements may have the same number but are distinguished by primes. For example, 109, 109', and 109" are three different elements which are similar or related in some way, but have significant modifications, e.g., a tire 109 having a static imbalance versus a different tire 109' of the same design, but having a couple imbalance. Such relationships, if any, between similar elements in the same or different figures will become apparent throughout the specification, including, if applicable, in the claims and abstract.

Figure 1C:
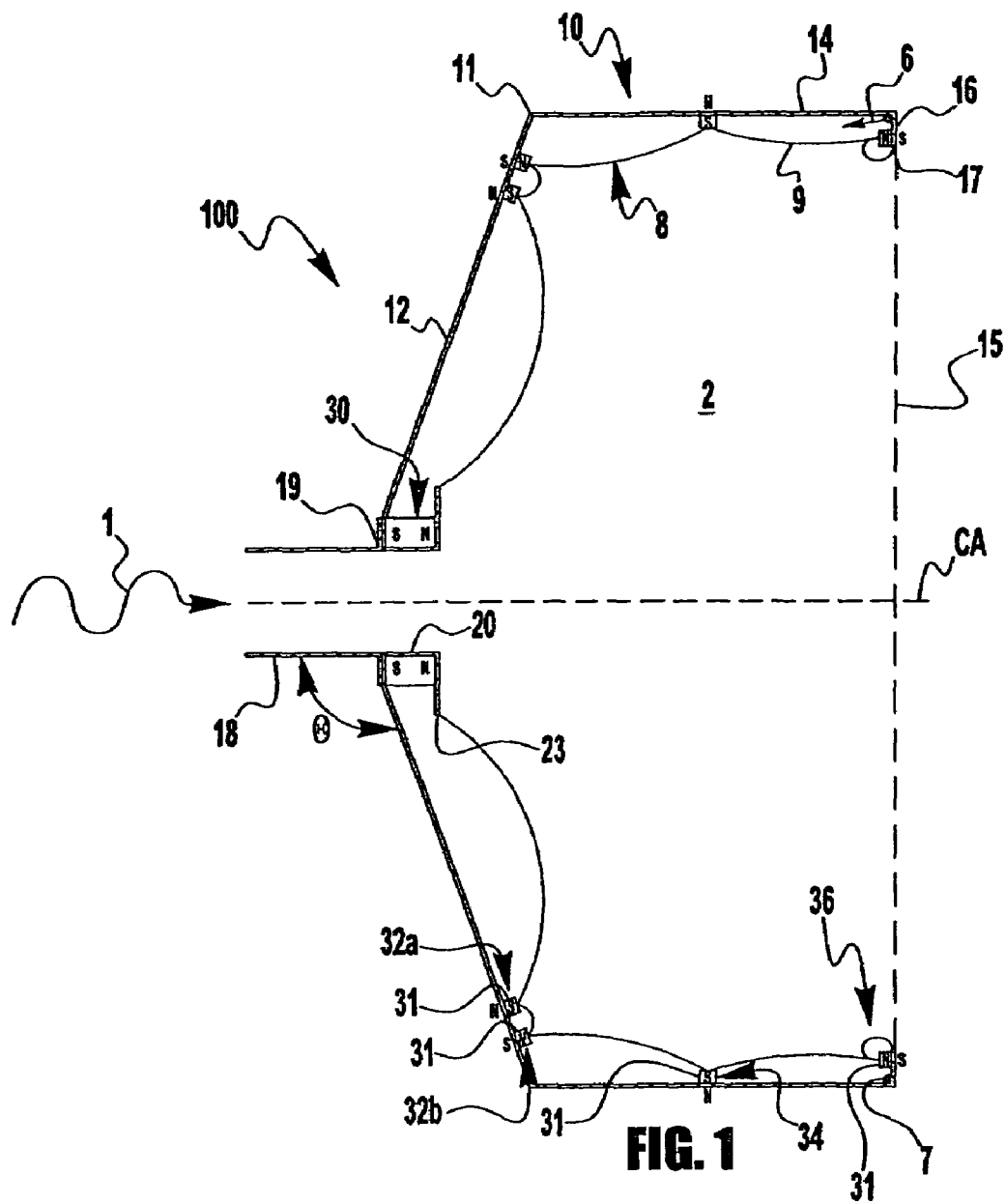
Figure 1C:
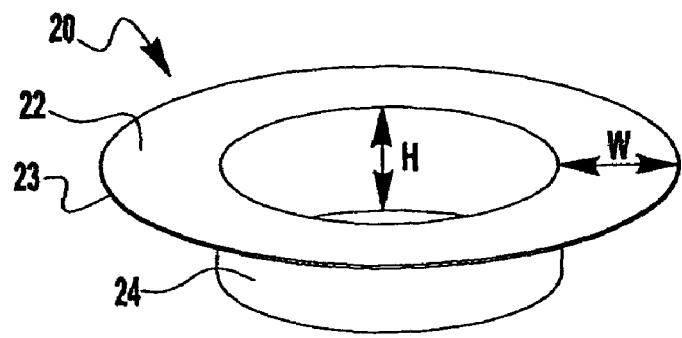
Figure 1A:
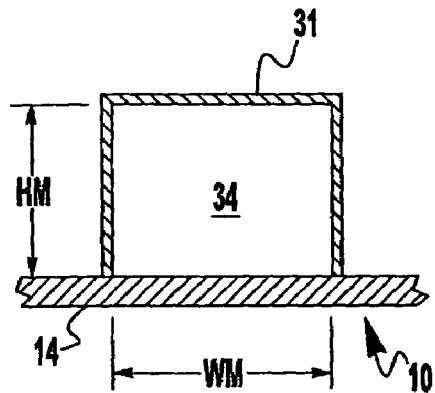
Figure 1B:
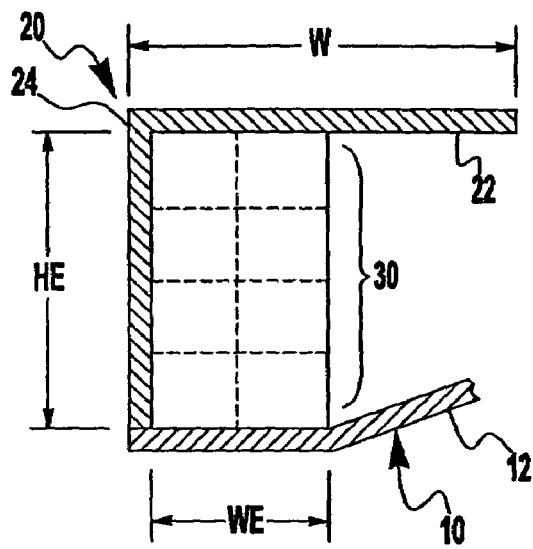
Figure 2:
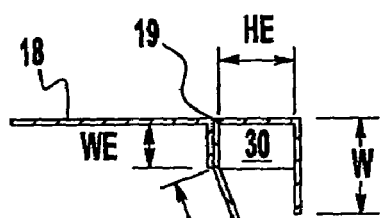
Figure 2:
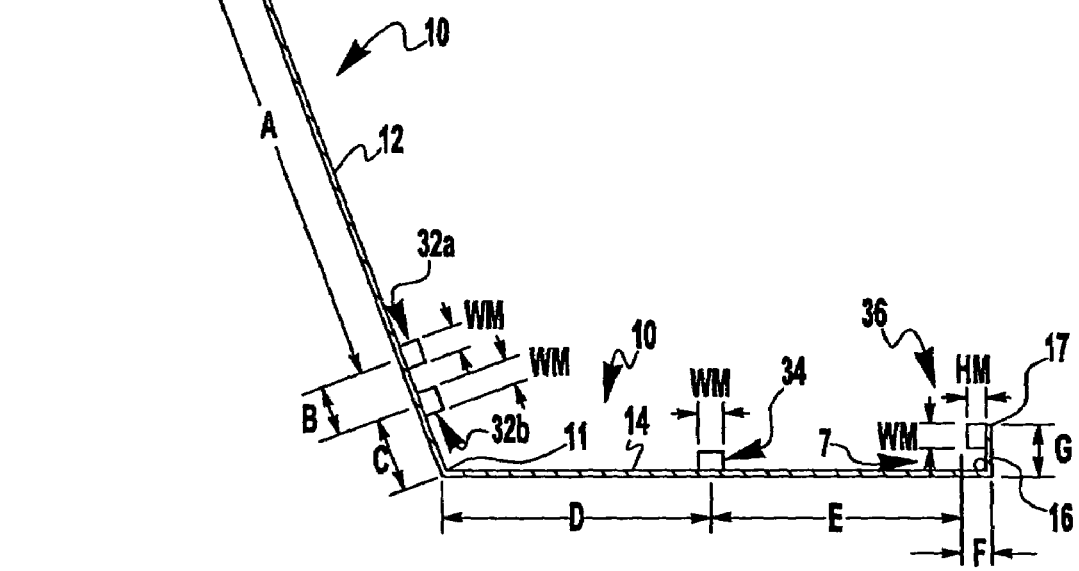
Figure 3:
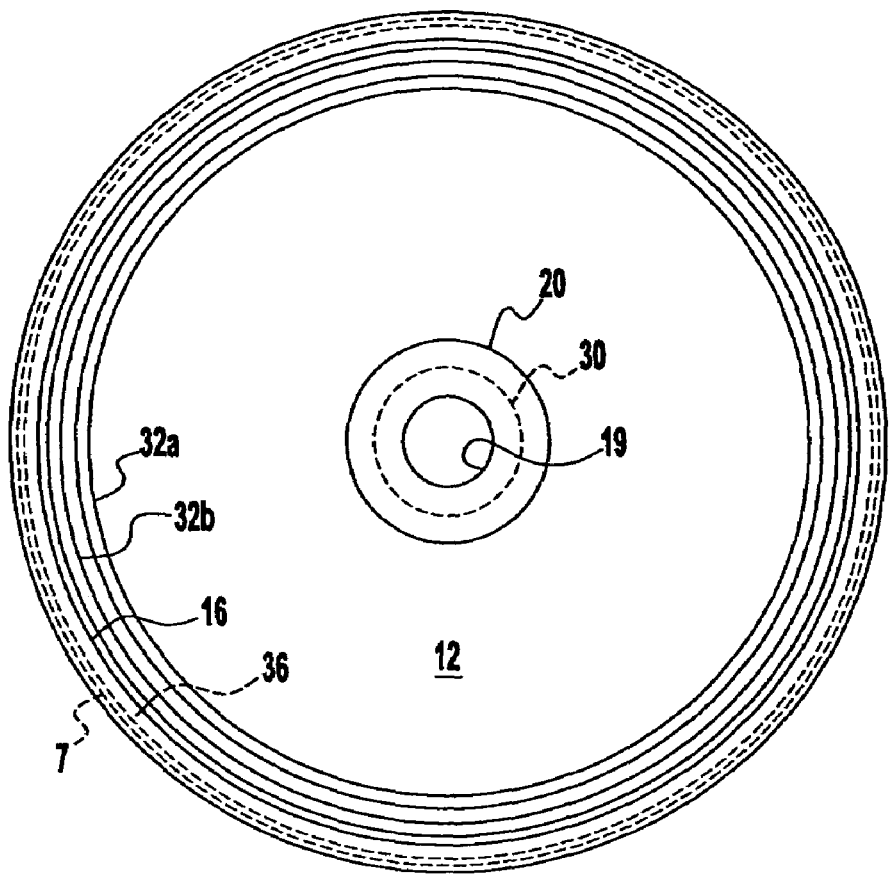
Figure 4:
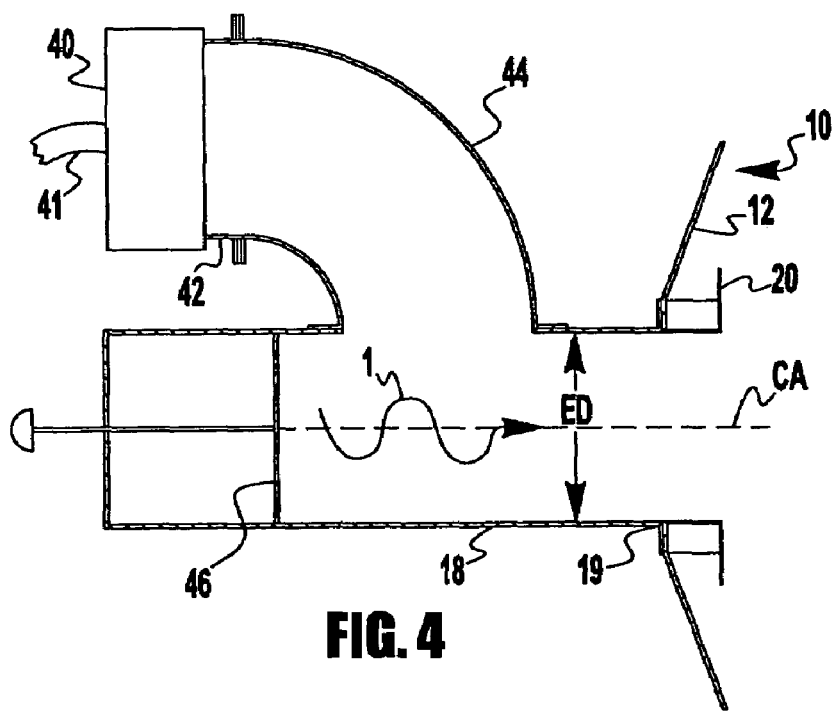
Figure 5:
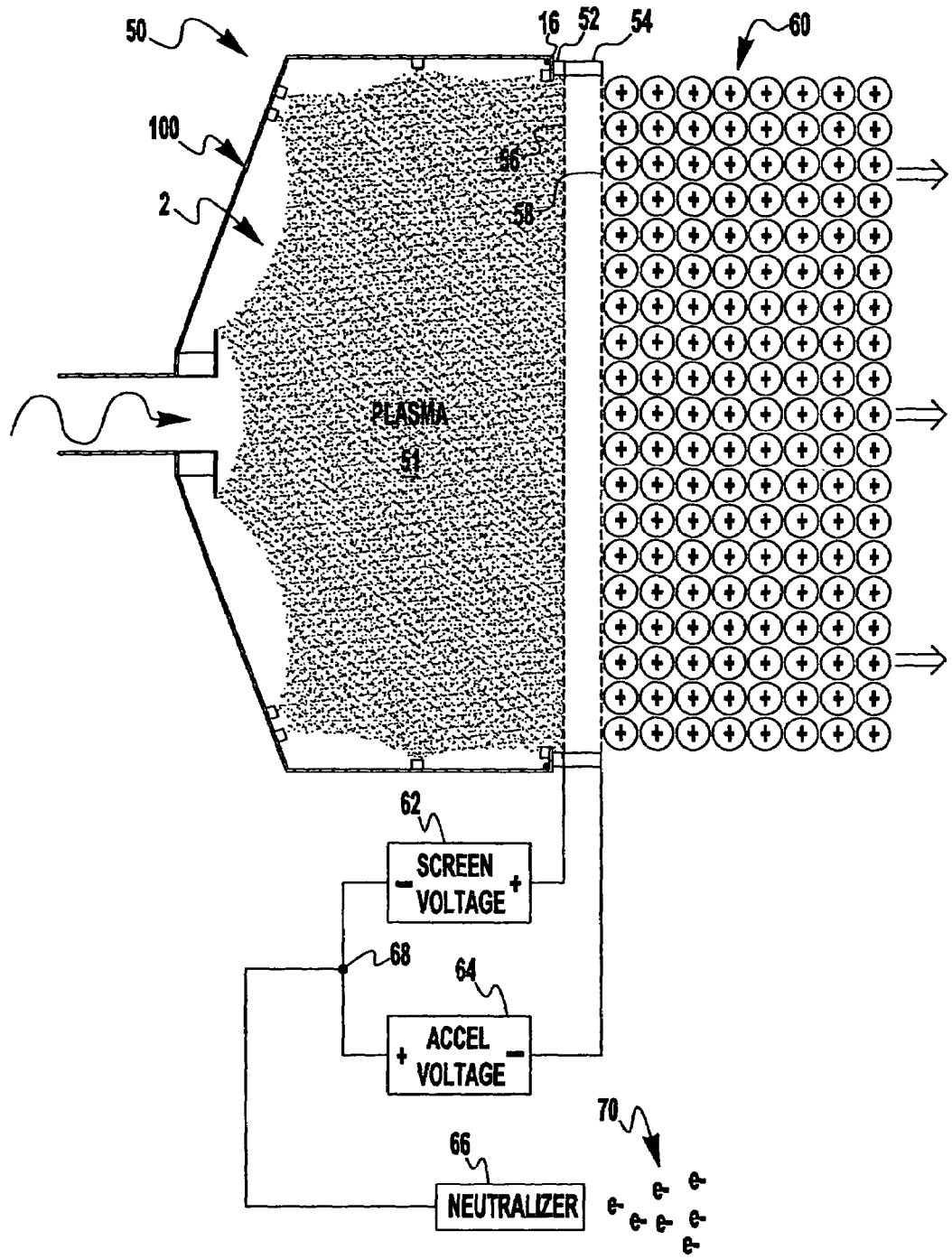

The structure, operation, and advantages of the present preferred embodiment of the invention will become further apparent upon consideration of the following description taken in conjunction with the accompanying drawings, wherein:

FIG. 1 is a side cross-sectional view of a plasma source, magnets not being shaded for clarity, all according to the invention;

FIG. 1A is a side cross-sectional view of a cylindrical section magnet ring with a cover, attached to a portion of a chamber wall, the magnet not being shaded for clarity, all according to the invention;

FIG. 1B is a side cross-sectional view of an entrance magnet ring with a pole piece, attached to a portion of the chamber wall, the magnet not being shaded for clarity, all according to the invention;

FIG. 1C is a perspective view of the pole piece for the entrance magnet ring, according to the invention;

FIG. 2 is an expanded view of half of the side cross-sectional view of the plasma source of FIG. 1, particularly showing dimensions, according to the invention;

FIG. 3 is a view of an exit end of the plasma source of FIG. 1, according to the invention;

FIG. 4 is a partial cross-sectional side view of an embodiment of microwave supply apparatus, the microwave source not being shown in cross-section, according to the invention;

FIG. 5 is a schematic side cross-sectional view of an ion thruster using the plasma source of FIG. 1, magnets and external devices not being shaded for clarity, all according to the invention;

FIG. 6 is a schematic side cross-sectional view of an ion/plasma processor using the plasma source of FIG. 1, magnets wafer and chuck not being shaded for clarity, all according to the invention; and FIG. 7 is a graph of test results for the ion thruster of FIG. 5, with plasma density plotted versus microwave power, according to the invention.

DETAILED DESCRIPTION OF THE INVENTION

FIG. 1 shows a preferred embodiment of a large area, partial conic, plasma generator (source) 100 according to the present invention. A ring cusp magnetic circuit 8 (indicated by magnetic field lines 9) surrounding on-axis injection of microwaves 1 provides electron cyclotron resonance (ECR) ionization of a gas introduced via a reverse feed plenum (gas injection ring) 16. An important feature is the magnetic circuit 8 that is designed such that dense plasma formation at a microwave entrance hole 19 is prevented, thereby minimizing reflected power while enhancing microwave power coupling. A further important feature is optimization of the magnetic circuit 8 for enabling efficient microwave power coupling without a dielectric body or window (e.g., dielectric bodies used for impedance matching in the prior art). The arrangement of components forming the magnetic circuit 8 optimizes plasma production and heating with heating modes including ECR heating (e.g., right hand circularly polarized heating, tunneling), and upper hybrid heating. As a result, uniform, high density plasma profiles are achievable even at low power operation, e.g., less than 200 W (watts), and therefore uniform, large area ion current densities may be extracted. Furthermore, the plasma source 100 is completely electrodeless and therefore eliminates erosion issues such as sputtering that are life limiting and can cause contamination.

Plasma Chamber

Referring to FIG. 1, the microwave plasma generator 100 comprises a plasma chamber 2 with a circular cross section wall 10, which is composed of relatively thick ferromagnetic material (e.g., 0.03" thick, 1020 mild steel) and that is formed as a hollow body having a conical section 12 and a cylindrical section 14. The plasma chamber 2 has a central axis CA being the axis of rotation for the circular cross section of elements of the plasma chamber 2. A cylindrical waveguide 18 is also aligned with the central axis CA for directing microwaves 1 through an open end at an approximately same-diameter (entrance inside diameter ED shown in FIG. 4) circular entrance hole 19 to the plasma chamber 2, wherein the microwaves 1 are traveling in the "downstream" direction shown by the arrowhead on the microwave symbolic arrow 1. The cylindrical waveguide 18 has an "open end" in the sense that there is nothing in the end at the entrance hole 19 (or in the entrance hole 19 either). For example, there is no microwave window or dielectric body as in many prior art plasma generators. The conical section 12 extends radially and axially outward from the entrance hole 19 (i.e., forming an obtuse cone angle θ with respect to the cylindrical waveguide 18), and joins the cylindrical section 14 at a junction 11. The cylindrical section 14 extends axially (longitudinally) outward (downstream) from the junction 11 to an exit flange 16. The axially (longitudinally) outward end, or exit end, of the cylindrical section 14 of the wall 10 is capped by an annular disk-shaped exit flange 16 that extends radially inward from the wall 10 a short distance sufficient to hold an exit magnet ring 36 radially inward from a gas injection ring 7. The exit flange 16 is composed of ferromagnetic material, preferably the same ferromagnetic material as the chamber wall 10. A radially inner edge 17 of the exit flange 16 delimits a planar surface that comprises an exiting hole, downstream end, or exit plane 15 for the plasma chamber 2.

Alternative embodiments of the plasma source 100 could have a cone angle θ of 90° or even less, however improved plasma production is obtained in the plasma chamber 2 when the cone angle θ is obtuse, and optimum plasma production has been obtained when the cone angle θ is approximately 110°. The effect of the cone angle θ is to determine a mix of heating modes between ECR heating (due to tunneling) and upper hybrid heating, because varying the cone angle θ varies the component of the magnetic field that is parallel or perpendicular to the microwave propagation vector 1. One can therefore optimize this mix of heating modes by experimenting with cone angles θ in the range of 95°-125°, or more preferably in the range of 100°-115°.

Although the preferred embodiment as illustrated and described herein has a circular cross section, this shape should not be considered limiting. For example, a plasma chamber 2 having a rectangular or square cross section about the central axis CA is within the scope of the present invention. Preferably the waveguide 18 and entrance hole 19 have the same inside dimensions and shape, therefore preferably a rectangular waveguide 18 would be used with a rectangular cross section plasma chamber 2. Furthermore, a shape described herein as "annular" when describing a circular cross section embodiment, should be understood to mean a polygonal ring conforming to the cross section of any non-circular cross section embodiment (e.g., a square annular ring for a square cross section embodiment).

The gas injection ring 7 is an approximately annular, continuous ring-shaped tube, composed of a non-magnetic material, with suitable gas injection holes oriented to direct injected gas flow substantially longitudinally inward (i.e., back upstream relative to the microwaves 1) and somewhat radially inward, as indicated by a gas injection directional arrow 6. Preferably the gas injection direction 6 is at an approximately 45° degree angle toward the back of the chamber 2 (i.e., longitudinally inward at approximately 45° with respect to the cylindrical section wall 14). This is a "reverse feed" configuration wherein the gas is directed away from the exit plane 15 to improve ionization efficiency. For example, the gas injection ring 7 is formed from one eighth inch (1/8" nominal) electro-polished stainless steel tubing. Ionization gas, e.g., xenon, is supplied through one or more conventional feed lines (not illustrated) that pass through the wall 10. It is within the scope of the present invention to place the gas injection ring 7 at any longitudinal position along the wall 10 of the cylindrical section 14, and with gas injection holes approximately directed 6 toward the longitudinal center of the plasma chamber 2. For example, the gas injection ring 7 is optionally positioned near the longitudinal center of the cylindrical section 14 and the gas injection holes are oriented to direct injected gas flow somewhat longitudinally inward and substantially radially inward. It is also within the scope of the invention to build the gas injection ring 7 into the wall 10, and/or to affix the gas injection ring 7 on the outside of the wall 10 with the gas injection holes directed into the plasma chamber 2 through the wall 10.

Magnetic Circuit

Referring now to FIGS. 1, 1A, 1B, 1C, 2 and 3, a specially designed and optimized magnetic circuit 8 (indicated by representative magnetic field lines 9) is comprised of permanent magnet rings 30, 32a, 32b, 34 and 36, plus field shaping elements including an entrance pole piece 20, the wall 10, and the exit flange 16. It will be seen that the field shaping elements 20, 10 and 16, all made of ferromagnetic material, form a magnetic field line-confining continuous sheet extending from a radially outer edge (rim) 23 of the entrance pole piece 20 around the wall 10 to the radially inner edge 17 of the exit flange 16. Unconfined magnetic field lines (e.g., lines 9) extend through space from magnet pole to magnet pole, ending at the rim 23 and the edge 17, thereby completing a path through the elements of the magnetic circuit 8.

The plural permanent magnet rings 30, 32a, 32b, 34, 36, which are composed, for example, of materials including samarium, cobalt and others having a high residual magnetic flux density, are preferably pre-formed as continuous approximately annular, circular rings, but may be conveniently formed as approximately annular, polygonal assemblies of, for example, rectangular bar magnets. The term "approximately annular" is used herein in the sense that, for example, a magnet ring may not be perfectly circular, and/or may have faces that are tilted relative to the radial or axial directions (e.g., a conical section magnet ring 32 that is essentially twisted such that a pole face will lie against the 20° slanted wall of the conical section 12).

A prototype plasma generator 100 was assembled using samarium-cobalt bar magnets measuring 0.25" wide (magnet width WM), by 0.20" high (magnet height HM), by 0.50" long, and permanently magnetized such that the N/S magnetic poles are at the top and bottom faces (i.e., the 0.25"× 0.50" faces). In the preferred embodiment, first and second conical section magnet rings 32a and 32b, respectively (collectively referred to as conical section magnet rings 32), a cylindrical section magnet ring 34, and an exit magnet ring 36 all have the same magnet height HM and magnet width WM wherein the magnet width WM is preferably somewhat greater than the magnet height HM (e.g., 25% greater). Actual magnet dimensions are only important from the standpoint that they provide the conditions for ECR heating, and that their exposed surface area is minimized to reduce recombination losses. The exact dimensions of the magnets depends on how powerful the magnets are. For example, utilizing a magnet with an increased energy product allows one to decrease the magnet's dimensions. Making the magnet width WM greater than the magnet height HM, however, does appear to provide advantages in optimizing ECR heating. A width to height ratio WM/HM is preferably in the range of 1.05-1.45, more preferably 1.20-1.35, and most preferably approximately equal to 1.25.

An entrance magnet ring 30 has an entrance magnet height HE and an entrance magnet width WE wherein the entrance magnet height HE is preferably somewhat greater than the entrance magnet width WE (e.g., 60% greater). For example, in the preferred embodiment, the 0.25"×0.20"×0.50" bar magnets were assembled long-end-to-long-end to create magnet rings (e.g., cylindrical section magnet ring 34 in FIG. 1A) with a magnet height HM of 0.20" and a magnet width WM of 0.25"; and were further stacked four high and two wide (as indicated by the dashed lines in FIG. 1B) to create an entrance magnet ring 30 with an entrance magnet height HE of 0.80" and an entrance magnet width WE of 0.50".

In order to make the most efficient use of the magnet rings 30, 32, 34, 36, and particularly to achieve the desired magnetic field shape at the microwave entrance, they are all placed on the inside of the plasma chamber wall 10 such that an outer pole face is touching, preferably attached to, the inside of the plasma chamber wall 10, which can then be made of ferromagnetic material to function as a pole piece magnetically tying together the outer poles of the magnet rings 30, 32, 34, 36. For protection from the plasma, all but the entrance magnet ring 30 are covered on their three exposed sides by a magnet cover 31 composed of a relatively thin, non-magnetic material (e.g., 0.01" thick stainless steel). The entrance magnet ring 30 is instead covered on two exposed sides by the entrance pole piece 20 that is composed of a relatively thick ferromagnetic material (e.g., 0.03" thick, 1020 mild steel). The entrance pole piece 20 will be described in more detail hereinbelow.

The magnetic circuit 8 is arranged to form a cusped magnetic field 9 surrounding the plasma chamber 2, but open (substantially no field lines 9) at the microwave entrance hole 19 and on the outward facing pole of the exit flange 16. The cusped magnetic field 9 is created by alternating the polarities of the magnet rings 30, 32, 34, 36 as one progresses in sequence along the chamber wall 10 from the entrance magnet ring 30 to intermediate magnet rings 32, 34 to the exit magnet ring 36. For example, as indicated in FIG. 1, the entrance magnet ring 30 has its N pole facing inward to the plasma chamber 2; the first conical section magnet ring 32a has its S pole facing inward; the second conical section magnet ring 32b has its N pole facing inward; the cylindrical section magnet ring 34 has its S pole facing inward; and the exit magnet ring 36 has its N pole facing inward.

An approximately annular entrance magnet ring 30 surrounds the entrance hole 19, both of which have the same circular cross section, share the same central axis CA, and have approximately the same inside diameter (ED as shown in FIG. 4). The entrance magnet ring 30 is attached inside the chamber wall 10 such that a first magnetic pole (e.g., S) is against the chamber wall 10 and a second opposed magnetic pole (e.g., N) is facing into the plasma chamber 2, thus aligning the poles with the central axis CA.

The ferromagnetic entrance pole piece 20 has a cylindrical axial face 24 that is attached to and extends substantially axially into the plasma chamber 2 from the entrance hole 19 to a continuing radial face 22 that extends radially away from the central axis CA across the inward facing magnetic pole (e.g., N) of the entrance magnet ring 30. Preferably, the radial face 22 extends radially farther away from the central axis CA then the entrance magnet ring 30, i.e., extending past the radially outermost extent of the entrance magnet ring 30. Further preferably the radial face 22 touches and/or is attached to the inward facing magnetic pole (e.g., N) of the entrance magnet ring 30. The axial face 24, being attached to the entrance hole 19, forms a cylinder having the same inside diameter ED as the entrance hole 19, and preferably touches and/or is attached to substantially all of the radially inside face of the entrance magnet ring 30, thereby sharing the same central axis CA.

The entrance pole piece 20 is an important feature of the present invention because the solenoidal magnetic field lines that would normally fill the radial interior of the approximately annular entrance magnet ring 30 are effectively constrained within an axial face 24 of the ferromagnetic entrance pole piece 20. Furthermore, the magnetic field lines emanating from the plasma-facing pole of the entrance magnet ring 30 are also effectively constrained within a radial face 22 of the entrance pole piece 20, and thus are directed to emanate into the plasma chamber 2 substantially from a radially outer edge 23 of the entrance pole piece 20, thereby keeping the magnetic field lines 9 far away from the entrance hole 19, as illustrated.

Thus the magnetic circuit 8 is designed such that plasma production does not occur on-axis CA in the throat of the waveguide 18 (nor within the entrance hole 19, nor within the radial interior of the entrance magnet ring 30, both of which effectively extend the waveguide 18 into the plasma chamber 2). Formation of such a "throat plasma" is undesirable because it gives rise to a poorly matched and inefficient discharge wherein reflected power tends to increase with increasing microwave power input because plasma density approaches the cut-off value for the microwaves 1. In contrast, the inventive magnetic circuit 8 is designed such that ECR, which generally occurs mostly in the area of cusps in the magnetic field 9 (where the B-field is most concentrated), takes place at the magnet rings 30, 32, 34, 36 but away from the microwave entrance hole 19 (away from the central axis CA). This contrasts with the prior art exemplified by Ichimura et al. '522, wherein the magnetic field is strong in the throat due to powerful magnets there and also due to a relatively narrow (small diameter) waveguide input. Ichimura's dielectric body (6) in his waveguide tube (5) acts as a microwave window that aids in impedance matching and also acts as a physical barrier to prevent parasitic throat plasma from forming due to ECR in the throat of the device. Formation of a throat plasma would essentially prevent efficient microwave coupling leaving only upper hybrid heating, resulting in a much lower plasma density than the present invention.

The present invention circumvents the issue of throat plasma formation (eliminating the need for a microwave window) by the use of a carefully optimized magnetic circuit 8 that allows for plasma production without plasma obstruction on axis. This allows good coupling of the microwaves 1 with the magnetic circuit 8, wherein heating at the magnet rings 30, 32, 34, 36 launches hot electrons which oscillate between magnetic cusps, generating plasma in the process.

Magnetic Circuit Optimization

Through calculations and experiments, the quantity, dimensions and placement of components of the magnetic circuit 8 have been optimized in order to maximize (in an optimally energy efficient way) production of a plasma that is of uniform density across the entire large area exit plane 15 (plane of the exit flange 16 within its inner edge 17).

The dimensions and placement of components of the magnetic circuit 8 have been optimized for a 40 cm (centimeter) diameter plasma chamber 2, but are easily scaled up to create even larger area plasma sources 100 according to the teachings herein of the present invention. Of course the source 100 could also be scaled down, if desired. Although the preferred embodiment includes three intermediate magnet rings 32a, 32b, 34 between the entrance magnet ring 30 and the exit magnet ring 36, scaled up or down embodiments may be implemented with more or fewer intermediate magnet rings 32, 34 between the entrance magnet ring 30 and the exit magnet ring 36. For example, instead of a pair of conical section magnet rings 32a, 32b; there could be a single conical section magnet ring 32 at the general location of the first and second conical section magnet rings 32a, 32b. However, it should be noted that the closely spaced and properly positioned pair of conical section magnet rings 32a, 32b has been found to cause optimally intensified plasma production. For example, there could be additional conical section magnet rings 32 positioned between the entrance magnet ring 30 and the first and second conical section magnet rings 32a, 32b. For example, there could be a plurality of cylindrical section magnet rings 34 spaced along the cylindrical section wall 14. For example, there could be no cylindrical section magnet ring 34.

Referring particularly to FIG. 2, but with reference to FIGS. 1, 1A, 1B, 1C, and 4, the dimensions relevant to the optimized magnetic circuit 8 of the preferred embodiment are disclosed, both in centimeters (and/or inches) for a 40 cm diameter plasma source 100, and also in relative terms using the magnet width WM as a relative unit of measurement (WM=0.25"=0.635 cm in the preferred embodiment). Thus, for example, a dimension of 1.5 WM should be understood as one-and-a-half times the magnet width WM, regardless of the numerical value of the magnet width WM. The dimensions are stated nominally, rounded to two decimal places, and ignore the thickness of the sheet metal components (e.g., components 10, 12, 14, 16, 18, 20, 31). Several dimensions are described as measuring to the "center" of a magnet ring. Specifically in this context, the term "center" should be understood to refer to the center of the cross-sectional width (WM) of the referenced magnet ring as illustrated in FIG. 2.

Various methods of scaling are contemplated: for example, ratioing magnet dimensions to wall dimensions; for example, positioning magnet rings according to the described proportions of wall length, with or without changing magnet dimensions; for example, ratioing pole piece dimensions to magnet dimensions; etc.

The diameter of the cylindrical section 14 (and the junction 11) is 40 cm (62.99 WM); the inside diameter ED of the entrance hole 19 (and the cylindrical waveguide 18 and the entrance pole piece 20) is 7.62 cm (3"=12.00 WM); and the inside diameter of the exit flange 16 is 60.45 cm (95.20 WM), as determined by a 0.50" (2.00 WM) width (seventh dimension G) for the exit flange 16. The magnet height HM is 0.51 cm (0.20"=0.80 WM). The entrance magnet height HE is (approximately) equal to an axial face height H for the entrance pole piece 20 which covers it and is 2.03 cm (0.80"=3.20 WM). The entrance magnet width WE is 1.27 cm (0.50"=2.00 WM), whereas a radial face width W for the entrance pole piece 20 which covers it is twice that, or 2.54 cm (1.00"=4.00 WM). In general, the entrance magnet width WE is less important than the radial face width W of the entrance pole piece 20, and it is more important that the radial face width W be greater than the entrance magnet width WE (e.g., twice as wide) and also greater than the entrance magnet height HE (e.g., a ratio W/HE of approximately 4/3.2=1.25).

A first dimension A measured along the wall 10 from the entrance magnet ring 30 to the center of the first conical section magnet ring 32a is 14.32 cm (22.60 WM). A second dimension B measured along the wall 10 from the center of the first conical section magnet ring 32a to the center of the second conical section magnet ring 32b is 1.37 cm (2.16 WM). A third dimension C measured along the wall 10 from the center of the second conical section magnet ring 32b to the junction 11 is 2.32 cm (3.65 WM). A fourth dimension D measured along the wall 10 from the junction 11 to the center of the cylindrical section magnet ring 34 is 7.16 cm (11.20 WM). A fifth dimension E measured along the wall 10 from the center of the cylindrical section magnet ring 34 to the axially innermost edge of the exit magnet ring 36 is 7.42 cm (11.69 WM). A sixth dimension F measured along the wall 10 from the axially innermost edge of the exit magnet ring 36 to the exit flange 16 is 0.51 cm (0.20"=0.80 WM) and is (approximately) equal to the magnet height HM. A seventh dimension G measured along the exit flange 16 from the cylindrical section 14 wall to the radially innermost edge of the exit magnet ring 36 is 1.27 cm (2.00 WM). The seventh dimension G is also (approximately) equal to the width of the exit flange 16 which extends radially inward to its inner edge 17 at the radially innermost edge of the exit magnet ring 36, thereby covering the entire axially outer pole face of the exit magnet ring 36.

Microwave Power Source

Referring particularly to FIG. 4, power is supplied to the plasma chamber 2 by introducing microwaves 1 traveling in the illustrated direction along the central axis CA (on-axis) into the plasma chamber 2 through the circular cross section entrance hole 19. In the preferred embodiment, the microwaves 1 are in the cylindrical TE11 mode at 2.45 GHz, and are introduced using a cylindrical waveguide 18 having a circular cross section entrance diameter ED (e.g., nominal 3" in the preferred embodiment). The entrance diameter ED is substantially the same for the cylindrical waveguide 18, for the entrance hole 19 to which it is joined, and for the entrance pole piece 20, all of which are aligned with the same central axis CA. Any suitable microwave power source can be employed, however in the preferred embodiment, a microwave source 40 (e.g., a magnetron) generates microwaves in a rectangular waveguide 42 which is communicatively connected to the cylindrical waveguide 18 by a rectangular-to-cylindrical waveguide transition 44 that is preferably shaped as a 90° elbow. For tuning and/or impedance matching purposes, a sliding short 46 is advantageously employed in the cylindrical waveguide 18. Although potentially limiting the power input, an alternative to directly mounting a magnetron on the rectangular waveguide 42 is to use a coax-to-waveguide adapter (transformer) as the microwave source 40, and to conduct the microwave power from a remote microwave generator (not shown) through a suitable microwave coaxial conductor 41. Also, suitable remote control actuators (not shown) can be provided for operation of the sliding short 46.

An advantage of using a coax-to-waveguide adapter 40 is that this helps to decouple microwave generation from plasma generation. The combination of the rectangular waveguide 42, the rectangular-to-cylindrical waveguide transition 44, the 90° bend, and the cylindrical waveguide also help to separate and decouple microwave generation from plasma generation, as well as helping prevent debris and contamination from reaching the microwave source (particularly when gravity is involved and the microwave source 40 is placed above the cylindrical waveguide 18 as illustrated).

Ion Thruster Application

FIG. 5 illustrates a desired application of the inventive plasma source 100, an ion thruster 50 for electric propulsion of spacecraft. The ion thruster 50 is open ended since it is intended to operate in the vacuum of outer space. Across the exit plane 15 of the plasma chamber 2, a screen grid 56 is mounted, for example on a suitable first insulating ring 52 attached between the periphery of the screen grid 56 and the exit flange 16. Axially outward of the screen grid 56, an accelerator grid 58 is mounted, for example on a suitable second insulating ring 54 attached between the periphery of the screen grid 56 and the periphery of the accelerator grid 58. As is conventional in the art, the screen grid 56 is electrically connected to a positive terminal of a screen voltage power supply 62, for extracting electrons from plasma 51 in the plasma chamber 2. Furthermore, the accelerator grid 58 is electrically connected to a negative terminal of an accelerator voltage power supply 64, for accelerating excess ions from the plasma 51 (that has been partially depleted of electrons) outward in an ion stream 60. A negative terminal of the screen voltage power supply 62 is tied to a positive terminal of the accelerator voltage power supply 64 through a common junction point 68. To prevent a positive space charge from collecting as an ion cloud that could obstruct/repel the ion stream 60, a neutralizer 66 is employed to generate a stream of electrons 70 that will recombine with the ions in the ion stream 60, thereby neutralizing the cloud back to an uncharged inert gas. A terminal of the neutralizer 66 is connected to the common junction point 68, thereby establishing an effective ground reference for the system, and also in effect bleeding off the electrons extracted by the screen grid 56. For long service life (e.g., 10 years continuous operation) with a minimum amount of erosion, the screen grid 56 and the accelerator grid 58 are composed of pyrolytic graphite. Furthermore, it should be noted that a uniform dense ECR plasma as provided by the inventive plasma source 100 minimizes grid erosion by reducing peaks in the ion current density profile at the ion extraction plane (exit plane 15). A uniform plasma density profile at the exit plane 15 also prevents issues such as crossover or over-focusing induced erosion.

Ion or Plasma Processing Application

FIG. 6 illustrates a desired application of the inventive plasma source 100, an ion or plasma processor 80 for use in manufacturing, e.g., processing of silicon wafers. It can be seen that the plasma 51 being a uniform plasma density over a large area (e.g., 40 cm diameter in the preferred embodiment) offers significant advantages for processing relatively large items, such as large silicon wafers. The circular cross section for the preferred embodiment offers an additional for processing circular objects, such as silicon wafers.

The ion or plasma processor 80 has a treating chamber 3 with an open entry attached on the open exit end of the plasma chamber 2, optionally with suitable grids (e.g., the screen grid 56 and the accelerator grid 58) affixed therebetween. Conventional electrical supplies and connections are assumed but not shown. An evacuation port 86 may be provided if the cylindrical waveguide 18 can be sealed. Alternatively, the entire ion or plasma processor 80 could be enclosed in a vacuum chamber. An object 82 to be treated (e.g., silicon wafer) is mounted appropriately on a chuck 84.

For ion processing (e.g., ion milling, ion implantation), the grids 56, 58 are employed, thereby converting the plasma 51 to a processing beam 81 of ions that impinge on the object 82. For plasma processing (e.g., plasma etching), the grids 56, 58 may be omitted, thereby allowing the plasma 51 to diffuse into the treating chamber 3 to become the processing beam 81 that impinges on the object 82.

Test Results

Laboratory testing of a preferred embodiment prototype plasma generator 100 configured as an ion thruster 50 confirmed excellent operational characteristics. Most of the lab testing apparatus described hereinbelow is not considered part of the present invention, and therefore may not be illustrated.

Testing took place in an aluminum vacuum chamber that is approximately 2.2 m in diameter and 7.9 m in length. Its pumping train includes a two-stage blower system backed by a roughing pump, a turbomolcular pump, and seven helium cryopumps. The approximate pumping speed was 110,000 l/s on xenon at $1\times10^{-6}$ Torr. The nominal base pressure was $1.3\times10^{-5}$ Pa ($1\times10^{-7}$ Torr) while background pressure at the highest flow rate condition investigated was $6.6\times10^{-4}$ Pa ($3\times10^{-6}$ Torr).

The exit plane 15 of the discharge chamber 2 was terminated using a stainless steel perforated electrode with physical open area fraction similar to that of two grid 56, 58 ion optics (20%). The electrode 56, 58 was biased to ion saturation to determine an estimate of the extractable ion current. The ion grid was also fitted with a series of 5 radial Faraday probes, measuring 6.35 mm in diameter. These probes were biased to ion saturation to assess ion current density uniformity in the plane of the optics. Additionally, a tungsten wire Langmuir probe was mounted inside the discharge chamber 2. The probe whose tip was approximately 5 mm long and 0.38 mm in diameter was used to assess bulk discharge properties as a function of operating condition. Axially, the probe was located approximately at the midpoint of the cylindrical section 12, extending radially approximately 11 cm. The magnetic field at the probe tip was approximately 15 Gauss. In this regard, probe analysis corrections to account for strong magnetic effects were not necessary.

Microwave power 1 at 2.45 GHz was introduced on-axis CA into the discharge chamber 2 using a cylindrical waveguide 18. The cylindrical waveguide attachment contained a sliding short 46 which was used for impedance matching. The cylindrical waveguide 18 was excited using a coax to waveguide adapter 40. The adapter's dominant excitation mode is the rectangular TE01. This mode is converted 44 to the cylindrical TE11 mode in the cylindrical waveguide 18, thus forming a microwave launcher. Coaxial lines 41 were used to feed power from a microwave magnetron, which was located on the atmosphere side of an evacuated tank, to the thruster's coax to waveguide adapter 40. Also located on the atmosphere side of the tank was a circulator to handle reflected power, a directional coupler to sample signals proportional to the forward and reflected power and a 3 stub tuner which was also used for microwave power impedance matching. Forward and reflected power signals were converted to actual power using two microwave power meters. In all cases, the reflected microwave power was less than 20%.

Though the microwave magnetron was capable of outputting over 1 kW of CW microwave power, experiments were typically limited to less than 250 W due to the limited power handling capability of the microwave cable 41. In order to investigate discharge operation at higher discharge powers, the microwave source 40 (e.g., magnetron) must be directly connected to the waveguide 42 as shown in FIG. 4.

Discharge Appearance: Because the microwave power 1 was introduced on centerline CA, the microwave propagation vector k is directed along the discharge axis CA. In this regard, the vector k is parallel to the magnetic field 9 vector at the surface of the entrance magnet ring 30 (i.e., the radial face 22 of the entrance pole piece 20), is 90 conical-section-angle degrees with respect to the magnetic field vector at the first conical section magnet ring 32a, perpendicular to the magnetic field vector at the second conical section magnet ring 32b and also at the cylindrical section magnet ring 34, and parallel to the magnetic field vector at the surface of the exit magnet ring 36. The orientation of the propagation vector k with respect to the magnetic field 9 vector as well as the vector k's approach direction both determine what type of electron heating, if any, will occur. It may be noted that the exit magnet ring 36 produces a magnetic field 9 vector that is parallel to the central axis CA, and that this orientation optimizes plasma containment and the ECR interaction zone at the exit magnet ring 36.

There are essentially two relevant modes of microwave 1 absorption (resonance) that can take place in the preferred embodiment's discharge chamber 2 configuration. The modes include the Right Hand Circularly Polarized mode (RHCP) and the Upper Hybrid frequency mode. If the propagation vector k is parallel to the magnetic field vector with the microwave radiation 1 approaching the ECR zone from the high field side, then absorption will always take place. In this case, the absorption occurs at the RHCP resonance where the microwave frequency equals the electron cyclotron frequency. Under these conditions, reflected microwave power is minimal and over-dense plasma production is possible, wherein the term "over-dense" refers to plasma densities in which the plasma frequency exceeds the radiation field frequency. Normally under such conditions, the radiation is simply reflected; however, the dispersion relation for RHCP absorption allows for the propagation of the radiation to the heating site. In this regard, though this form of heating is most desirable, it is not usually straightforward to design using permanent magnets-only configurations. Nevertheless, the inventive design of the magnetic circuit 8 has created conditions for this form of absorption to exist at the entrance magnet ring 30. Furthermore, upper hybrid heating resonance conditions are satisfied at the conical section magnet rings 32 and the cylindrical section magnet ring 34 where the microwaves 1 approach the resonant zones with the k vector perpendicular to the magnetic field. Additionally, the k vector approach to these heating zones is advantageously from the weak magnetic field side. At plasma densities corresponding to plasma frequencies above the microwave excitation frequency, this absorption process should cease. In reality, microwaves 1 can tunnel through the separation between the cutoff and the resonance, thereby allowing for the formation of densities above the critical plasma density (defined as the condition where the plasma frequency equals the microwave frequency). Absorption at the exit magnet ring 36 is likely due to a combination of Upper Hybrid frequency production and tunneling to the RHCP resonance. It should be pointed out that microwave radiation not absorbed can be converted to other modes by scattering, which changes the direction of the propagation vector k, making the scattered microwaves more or less absorbable via the processes described above.

The above mentioned absorption processes are useful in interpreting the appearance of the plasma 51 discharge as observed during testing. The discharge appearance reflects qualitatively what absorption modes are active in the discharge chamber 2. The discharge in the tested 40 cm diameter chamber 2 appears to have several distinct modes of operation. In general at low input microwave powers less than 100 W, the ECR plasma production is localized primarily at the most upstream magnet rings (e.g., the conical section magnet rings 32). In this regard, at low powers Upper Hybrid Resonance can be expected to dominate. As the power approaches 100 W, an annular region near the rim 23 of the entrance pole piece 20 becomes luminous as well. In this mode, the discharge overall is fairly dim, but its brightness intensifies with increasing flow rate of the xenon gas from the gas injection ring 7 (internal pressure). This increase is attributed to increased neutral gas-electron collisions which tends to generate a secondary main discharge plasma in the bulk. In any case, the ECR action locally at the rings is very intense in contrast to the bulk of the discharge 51. The core plasma of these rings has a white tone, indicating a very intense and localized interaction between very hot electrons and neutral gas. The brightening of the bulk discharge with increasing power in this mode is most due likely to increased production of hot electrons that ultimately diffuse into the bulk and excite/ionize neutrals there.

As the microwave power is increased between 100 W and 150 W, an intense plasma glow is additionally observed at the most upstream magnet ring near to the entrance hole 19 (i.e., the rim 23 of the entrance pole piece 20 covering the entrance magnet ring 30). This plasma production mechanism is likely due to RHCP heating. The bulk discharge brightness also increases with the appearance of this new mode. With increasing microwave power greater than 150 W, the discharge jumps into an operating mode dominated by volume (bulk) excitation. In this mode the distinct ECR plasma production sites at the magnet rings are either absent or completely washed out by the intense volume glow. It is postulated that the jump into this mode is due to RHCP heating and possibly anomalous heating at the most upstream ring, the entrance magnet ring 30. The presence of plasma at this ring in the intermediate microwave power mode provides a medium for the RHCP radiation to couple into, thereby enabling over-dense plasma production to take place there. Plasma production improves with increasing input microwave power ultimately culminating in a very bright discharge that is characterized by high density and high uniformity.

Discharge Plasma Properties: Plasma characteristics such as bulk density, plasma potential and electron temperature were measured over the power range investigated. Average extractable ion current at the discharge chamber exit plane 15 was measured by biasing the ion optics simulator grid. In addition to these measurements, radial button probes were used to measure the ion current uniformity at the exit plane.

The plasma measurements acquired were consistent with the visual observations made as net input microwave power was increased from 0 to 200 W. FIG. 7 illustrates the variation in the bulk plasma density as measured using a Langmuir probe between 0 and 200 W at a gas injection flow-rate of approximately 20 SCCM (standard cubic centimeters per minute). Plasma density is expressed as ion quantity per cubic centimeter, divided by $10^7$ (ten to the seventh power). As can be observed here, there is a distinct jump in plasma density as microwave power increases appreciably above 140 W. This jump is associated with the visually observed transition to the full volume plasma production mode. In the "low mode," plasma density increases very slowly with increasing microwave power with an average increase in density of $0.00111 \times 10^{10}/cm^3/W$. As illustrated in FIG. 7, the plasma density increases by over a factor of 5 as the power increases from 140 W to 170 W. The rate of growth in density with increasing discharge power in the "high mode" is considerably higher than "low mode growth." Plasma density growth in the "high mode" is nearly linear, increasing $0.00845 \times 10^{10}/cm^3/W$ in the high mode.

The plasma potential was observed to drop as the plasma jumps from low mode to high mode, the plasma potential drop being as much as a factor of two as power is increased from 0 to 200 W, and proceeding in concert with the increase in plasma density. The measured plasma potential suggests a plasma 51 to screen grid 56 potential difference of the order one tenth that of a prior art "NSTAR" thruster. In general, reduced plasma potential is desirable for ion thruster operation in that the energy of ions falling out of the discharge into the screen grid is reduced.

The electron temperature does not vary appreciably as the plasma transitions from low mode to high mode. Its value was approximately 2 eV over the tested power range and at the tested gas flow rate. The relative flatness in the electron temperature with increasing input power suggests that the improved discharge performance in the high mode is not so much a consequence of better heating of the electrons, but more so an increase in the number of regions where plasma production is taking place.

It is postulated that RHCP absorption at the entrance magnet ring 30 (i.e., at the pole piece rim 23) may play a major role in the improved discharge characteristics in the high mode. The plasma measurements were point measurements in the bulk plasma that should be representative of volume plasma processes. In this regard, the gradients measured as power is increased represent improved volume plasma production with the transition into the high mode. The highest plasma density condition observed in this mode corresponded to a plasma density 50% less than the cut-off frequency of $7.45 \times 10^{10}$ #/cm$^3$, indicating that the plasma density was still below cut-off. Near the magnet rings, the plasma density may be much larger than that measured by the Langmuir probe which sampled the bulk of the discharge, near centerline CA. In this regard, because the microwave frequency was greater than the cut-off frequency at these plasma densities, microwave power can indeed propagate through the bulk and be absorbed at the ECR sites. Given the slope of change in plasma density with increasing discharge power, it is expected that the cutoff density would be obtained in the bulk plasma at a microwave input power of 700 W. It follows then that increasing the input microwave power should bring about further increases in the plasma density. This study was limited to operating microwave input powers less than 250 W due to coax cable over-heating which tended to fail at power levels above 250 W.

The ion current to the biased ion optics simulator grid also increased significantly as the discharge transitioned from low mode to high mode. Behavior similar to that observed in the plasma density and plasma potential with increasing microwave power was observed but there are some differences. At a fixed injection gas flow rate of 20 SCCM, the grid current in high mode did not increase appreciably with increasing discharge power. The grid current's average value was approximately 0.75 A. This result suggests that the radial plasma density distribution might be changing with increasing microwave power. The density may be increasing in the bulk, and decreasing in the wings so that the net change in current collected at the grid is nearly zero.

Changes in the current density distribution as measured using radial probes mounted on the ion optics simulation electrode seem to support this notion. A distinct change in the ion current distribution was observed in measurements of the ion current density profile as the plasma progressed from high mode to low mode. Indeed, the plasma density profile becomes very uniform as the plasma proceeds into the high mode, whereas in the low mode the ion current density is peaked at the edges, (near the discharge chamber wall 10). The absence of a peaked current density profile is highly desirable from an ion extraction standpoint.

The measured current density distribution is consistent with the visual observations. In the low mode, the most prominent plasma excitation occurs at the magnet rings. It is therefore to be expected that the current density would be peaked at the wings in the low mode. The observed volume excitation in the high mode is consistent with the improved current density uniformity.

In this investigation, grid currents up to 0.82 A (amps) were achieved (at a gas injection flow rate of 12.5 SCCM). This grid current is within 7 percent of the equivalent Amperes of injected xenon gas. This data suggests an uncorrected utilization of order 93%, suggesting high ionization capability. This collected grid current is consistent with an average plasma approximately 75% of cut-off plasma density. Because bulk plasma densities were of order a factor of two times lower than the cutoff, the actual plasma 51 may very well be a supposition of over-dense plasma near the magnet rings 30, 32, 34, 36 and under-dense plasma in the bulk. This data suggests that large increases in microwave 1 power beyond 200 W may not be necessary to achieve the target of a one Ampere ion beam 60.

The discharge efficiency as characterized by ion production costs (power required) was also determined for the 20 SCCM flow condition, and there is also a distinct change in functional behavior as power is increased. The low mode is characterized by high ion production costs (from 250 to 650 W/A) with a steep slope indicating sharply increasing losses with increasing input power. A sudden jump to the high mode is characterized by reduced ion production costs (approximately 200 W/A) and a much shallower slope indicating that discharge efficiency with increasing power degrades at a significantly lesser rate with increasing power than that observed in the low mode. It is expected that the ion production costs can be improved by either increasing the microwave frequency or by increasing the input power to achieve anomalous heating.

Altogether, the data indicates that high mode operation is best for ion thruster 50 operation. To fully characterize the source, higher power levels must be investigated, requiring replacement of the microwave coax 41 source 40 with an all-wave-guide microwave source 40. This approach should allow for over 1 kW (kilowatt) of microwave 1 power to be deposited into the plasma chamber 2. If cut-off in the bulk plasma 51 is reached or exceeded by anomalous heating, then a minimum of 1.1 A should be available for extraction in the ion beam 60.

CONCLUSION

The plasma source 100 produces a large area, uniform, dense plasma 51 at low input powers, and utilizes only permanent magnets to generate the plasma 51. The high uniformity makes it applicable for plasma processing applications 80. The plasma source 100 operates at low pressures, for example less than 0.0001 Torr, that is idea for plasma processing 80. Also, the plasma potential is very low, for example less than 3.0 Volts. Furthermore, the electron temperature is low and does not vary appreciably with power.

As a result of these characteristics, the uniform large area source 100 can be exploited for large wafer processing applications. No power hungry electromagnets are required. Low plasma potentials reduce the likelihood for sputtering. High exit plane ion current densities will yield desirable high etching or deposition rates. No microwave window is required, enabling efficient coupling with microwave power, and eliminating a common source of contamination and other problems in plasma generators 100.

In summary the inventive plasma source 100 is unique in comparison with prior art ECR plasma/ion sources in that it produces high current densities but in a uniform density discharge. Additionally, it does not require cumbersome, energy-hungry electromagnets. It also operates at only 2.45 GHz, a relatively low cost excitation frequency. Additionally, it does not require a microwave window which would otherwise be a contamination source, and in ion beam applications a microwave window could also become coated, thereby preventing microwaves 1 from coupling into the plasma chamber 2 for producing a plasma 51.

This technology is applicable to the semiconductor manufacturing sector. The large area, very uniform plasma produced by the above described source makes ideal for the processing of very large silicon wafers. Such processing includes etching and deposition steps along the way to producing computer chips.

The original purpose of the innovation was to electrodelessly generate a uniform high density plasma to feed high voltage ion optics. The entire system, otherwise known as an ion thruster, accelerates the ions from the plasma to produce thrust. The inventive ECR plasma source 100 features an optimized permanent magnet circuit 8 to generate resonance surfaces. The microwaves 1 are injected on centerline axis CA. The resulting discharge plasma 51 jumps into a "high mode" at input powers greater than 150 W (at 2.45 GHz). This mode is associated with elevated plasma density and high uniformity. Though the original application of this plasma source 100 was that of an ion source for ion thruster 50 applications, the plasma source 100 itself is of general applicability. For example, the plasma source 100 can be used as a processor 80 of silicon wafers (e.g., plasma etchers), or could be used to generate a broad ion beam 81 for ion milling or implantation applications.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected.

Undoubtedly, many other "variations" on the "themes" set forth hereinabove will occur to one having ordinary skill in the art to which the present invention most nearly pertains, and such variations are intended to be within the scope of the invention, as disclosed herein.

What is claimed is:

1. A plasma source comprising:
    a plasma chamber having a central axis, an entrance hole having the same central axis at one axial end of the chamber and an exit plane having the same central axis at an opposed axial end;
    a chamber wall composed of a ferromagnetic material that extends from the entrance hole to the exit plane to surround the plasma chamber;
    an approximately annular entrance magnet ring surrounding the entrance hole, and attached inside the chamber wall such that a first magnetic pole is against the chamber wall and a second opposed magnetic pole is an inner pole facing into the plasma chamber; and
    an entrance pole piece composed of a ferromagnetic material, having a first face that is attached to and extends substantially axially into the plasma chamber from the entrance hole to a continuing second face that extends perpendicularly away from the central axis across at least a portion of the inner pole of the entrance magnet ring, and the second face extends farther away from the central axis than the entrance magnet ring;
    a microwave waveguide having an inside dimension approximately equal to an inside dimension of the entrance hole, and having the same central axis as the plasma chamber, wherein the waveguide has an open end attached to the entrance hole and is aligned for directing microwaves through the entrance hole along the central axis into the plasma chamber;
    a first section of the wall that extends out away from the central axis from the entrance hole to a peripheral junction;
    a second section of the wall that extends mostly axially from the junction to the exit plane;
    an approximately annular first intermediate magnet ring attached inside the wall near the junction such that a one of its first and second magnetic poles is against the wall and the one magnetic pole's opposed magnetic pole is facing into the plasma chamber;
    an annular exit flange composed of a ferromagnetic material, that is attached to and extends into the plasma chamber toward the central axis along the exit plane from the wall to an inner edge;
    an approximately annular exit magnet ring surrounding the inner edge of the exit flange, and attached inside the exit flange such that a one of its first and second magnetic poles is against the exit flange and the one magnetic pole's opposed magnetic pole is facing into the plasma chamber; and
    a magnetic circuit configuration wherein all magnet rings are composed of permanent magnet material such that inward facing magnetic poles alternate polarity versus adjacent magnet rings while proceeding along the wall sequentially from the entrance magnet ring to the exit magnet ring.

2. A plasma source according to claim 1, wherein the first intermediate magnet ring further comprises:
    a pair of relatively closely spaced, approximately annular, oppositely polarized magnet rings, both being attached inside the first section of the wall.

3. A plasma source according to claim 1, further comprising:
    an approximately annular second intermediate magnet ring attached inside the wall between the first intermediate magnet ring and the exit magnet ring, such that a one of the second intermediate magnet ring's first and second magnetic poles is against the wall and the one magnetic pole's opposed magnetic pole is facing into the plasma chamber.

4. A plasma source according to claim 1, wherein:
    the plasma source has a circular cross section in any plane normal to the central axis, such that the circular cross sections are coaxial with the central axis;
    the waveguide is a cylindrical waveguide;
    the first section of the wall is conical, extending radially outward from the entrance hole at an obtuse angle (?) with respect to the waveguide; and
    the second section of the wall is substantially cylindrical.

5. A plasma source according to claim 4, wherein the plasma source configuration and dimensions are optimized such that:
    the first intermediate magnet ring further comprises a pair of relatively closely spaced, approximately annular, oppositely polarized first and second conical section magnet rings, both being attached inside the first section of the wall;
    an approximately annular second intermediate magnet ring is attached inside the second section of the wall between the first intermediate magnet ring and the exit magnet ring, such that a one of the second intermediate magnet ring's first and second magnetic poles is against the wall and the one magnetic pole's opposed magnetic pole is facing into the plasma chamber;

the exit magnet ring, and all of the intermediate magnet rings have a magnet width dimension WM measured normal to a magnet ring circumferential direction and parallel to the wall or exit flange, whichever the magnet ring is attached to; and have a magnet height measured mutually orthogonal to the magnet width (WM) and to the magnet ring circumferential direction, such that the magnet width dimension WM is between 1.05 and 1.45 times the magnet height;

measured in units of magnet width dimension WM: the diameter of the cylindrical section is 62.99 WM; the inside diameter of the entrance hole, the cylindrical waveguide and the entrance pole piece is 12.00 WM; and the inside diameter of the exit flange is 95.20 WM;

also measured in units of magnet width dimension WM: an entrance magnet height is approximately equal to an axial face height for the entrance pole piece which covers it and is 3.20 WM; an entrance magnet width is 2.00 WM, whereas a radial face width for the entrance pole piece which covers it is approximately 4.00 WM;

also measured in units of magnet width dimension WM: a first dimension measured along the wall from the entrance magnet ring to the center of the first conical section magnet ring is 22.60 WM; a second dimension measured along the wall from the center of the first conical section magnet ring to the center of the second conical section magnet ring is 2.16 WM; a third dimension measured along the wall from the center of the second conical section magnet ring to the junction is 3.65 WM; a fourth dimension measured along the wall from the junction to the center of the cylindrical section magnet ring is 11.20 WM; a fifth dimension measured along the wall from the center of the cylindrical section magnet ring to the axially innermost edge of the exit magnet ring is 11.69 WM; a sixth dimension measured along the wall from the axially innermost edge of the exit magnet ring to the exit flange is 0.80 WM; a seventh dimension measured along the exit flange from the cylindrical section wall to a radially innermost side of the exit magnet ring is 2.00 WM; and the seventh dimension is approximately equal to a radially-measured width of the exit flange.

6. A plasma source according to claim 5, wherein:
the magnet height is 0.80 times the magnet width dimension WM; and
the radial face width for the entrance pole piece is 4.00 times the magnet width dimension WM.

7. A plasma source according to claim 4, wherein:
the obtuse angle (?) is approximately 110 degrees.

8. A plasma source according to claim 4, further comprising:
a microwave source feeding microwave power into a rectangular waveguide; and
a rectangular to cylindrical waveguide transition connected to the cylindrical waveguide for feeding microwave power into the cylindrical waveguide.

9. A plasma source according to claim 8, further comprising:
a sliding short in the cylindrical waveguide.

10. A plasma source according to claim 1, further comprising:
a magnet cover composed of nonmagnetic material that covers exposed surfaces of all magnet rings except for the entrance magnet ring.

11. A plasma source according to claim 1, wherein:
the ferromagnetic material is 0.03 inches thick.

12. A plasma source according to claim 1, further comprising:
a tubular gas injection ring attached to the second section of the wall, such that gas is injected approximately upstream relative to the microwaves.

13. A plasma source according to claim 12, wherein:
the gas injection ring is attached close to the exit flange and radially between the exit magnet ring and the wall.

14. A method for efficiently coupling microwave power input with gas in a plasma generating chamber, the method comprising the steps of:

surrounding the plasma chamber with a wall that has a central axis and an entrance hole having the same central axis for providing an opening through the wall at one axial end of the plasma chamber;

directing microwaves from an open end of a waveguide through the entrance hole into the plasma chamber along the central axis, wherein the central axis is shared by the waveguide;

composing the wall of a ferromagnetic material;

attaching an approximately annular entrance magnet ring inside the chamber wall surrounding the entrance hole, such that a first magnetic pole is against the chamber wall and a second opposed magnetic pole is an inner pole lacing into the plasma chamber; and providing an entrance pole piece composed of a ferromagnetic material, having a first face that is attached to and extends substantially axially into the plasma chamber from the entrance hole to a continuing second face that extends perpendicularly away from the central axis across at least a portion of the inner pole of the entrance magnet ring;

extending the second face farther away from the central axis than the entrance magnet ring;

forming a first section of the wall that extends out away from the central axis from the entrance hole to a peripheral junction such that the first section is sloped at an obtuse angle (?) with respect to the waveguide;

forming a second section of the wall that extends mostly axially from the junction in a direction away from the waveguide; and generating a cusped magnetic field inside the chamber by attaching inside the wall one or more spaced apart, approximately annular, magnet rings such that outward facing magnetic poles are against the wall and inward facing magnetic poles alternate polarity versus adjacent magnet rings while proceeding along the wall sequentially away from the entrance magnet ring.

15. The method of claim 14, wherein:
the wall has a circular cross section in any plane normal to the central axis, such that the circular cross sections are coaxial with the central axis;
the waveguide is a cylindrical waveguide;
the first section of the wall is conical, extending radially outward from the entrance hole at an obtuse angle (?) with respect to the waveguide; and
the second section of the wall is substantially cylindrical.

16. The method of claim 14, further comprising the step of:
using permanent magnets for all of the magnet rings.

* * * * *